United States Patent [19]
Morita et al.

[11] Patent Number: 5,418,374
[45] Date of Patent: May 23, 1995

[54] SEMICONDUCTOR DEVICE HAVING AN ACTIVE LAYER WITH REGIONS WITH DIFFERENT BANDGAPS

[75] Inventors: Etsuo Morita, Kanagawa; Shigetaka Tomiya, Tokyo; Tadashi Yamamoto; Akira Ishibashi, both of Kanagawa, all of Japan

[73] Assignee: Sony Corporation, Tokyo, Japan

[21] Appl. No.: 70,204

[22] Filed: Jun. 2, 1993

[30] Foreign Application Priority Data

Jun. 3, 1992 [JP] Japan ................................. 4-142842

[51] Int. Cl.⁶ .......................... H01L 33/00; H01S 3/19
[52] U.S. Cl. ......................................... 257/13; 257/96; 257/627; 257/628; 372/45; 372/46
[58] Field of Search ............... 372/45, 46, 43; 257/13, 257/94, 95, 96, 20, 187, 192, 627, 628

[56] References Cited

U.S. PATENT DOCUMENTS

| | | | |
|---|---|---|---|
| 4,764,936 | 8/1988 | Taneya et al. | 372/50 |
| 4,835,788 | 5/1989 | Yamaguchi | 372/46 |
| 4,932,033 | 6/1990 | Miyazawa et al. | 372/46 |
| 5,070,510 | 12/1991 | Konushi et al. | 372/46 |
| 5,128,276 | 7/1992 | Ambrosius et al. | 372/46 |
| 5,255,280 | 10/1993 | Harui et al. | 372/46 |
| 5,255,281 | 10/1993 | Sugano et al. | 372/46 |
| 5,271,028 | 12/1993 | Kondo et al. | 372/45 |
| 5,280,493 | 1/1994 | Takiguchi et al. | 372/46 |

FOREIGN PATENT DOCUMENTS 2-65288 5/1990 Japan ................................. 372/46

OTHER PUBLICATIONS

Narui et al, "Low Threshold AlGaAs BH Lasers Fabricated by One-Step MOCVD", *Electronics Letters*, 15th Sep. 1988, vol. 24, No. 19, pp. 1249–1250.

Morita et al, "Epitaxial Growth of GaInP on (111)A and (111)B Surfaces by Metalorganic Chemical Vapor Deposition", *Journal of Crystal Growth*, vol. 106, 1990, pp. 197–207.

*Primary Examiner*—Robert P. Limanek
*Assistant Examiner*—Minhloan Tran
*Attorney, Agent, or Firm*—Hill, Steadman & Simpson

[57] ABSTRACT

A ridge or groove is formed on a major surface of a semiconductor substrate which is formed on a first electrode and whose major surface having a ridge or groove is slanted to a <110> crystal axis direction from a {001} crystal plane. A first semiconductor layer is formed on the semiconductor substrate, then a semiconductor function layer deviating from a {111} B crystal plane is formed on the first semiconductor layer, then a second semiconductor layer is formed on the semiconductor function layer and then a second electrode is formed on the second semiconductor layer. The ridge or groove extends to the <110> crystal axis direction, and at least one of the first semiconductor layer, the semiconductor function layer and the second semiconductor layer includes phosphorus.

14 Claims, 5 Drawing Sheets

SEMICONDUCTOR DEVICE HAVING AN ACTIVE LAYER WITH REGIONS WITH DIFFERENT BANDGAPS

BACKGROUND OF THE INVENTION

1. Field of the Invention

The present invention generally relates to compound semiconductor devices and methods of fabricating the same and, more particularly, is directed to a compound semiconductor device constituted by a compound semiconductor including phosphorus (P) and a method of fabricating the same.

2. Description of the Prior Art

In a compound semiconductor device, for example, a compound semiconductor laser device, a so-called buried hetero (BH) type structure is required in order to decrease its threshold current in which an index of refraction is differed to both a lateral direction (direction in parallel to a cleavage plane) and a vertical direction (direction perpendicular to the cleavage plane) and a current limiting portion is provided to thereby confine carriers in the vicinity of a light emission region. The BH type semiconductor laser device can be fabricated mainly by the following two methods, for example. In one method, after a first cladding layer, an active layer and a second cladding layer are sequentially formed by the crystal growth process, then the second cladding layer and the active layer are partially etched away to the first cladding layer to form a so-called ridge structure, then the ridge is buried by a buried layer having a bandgap larger than that of the active layer which is formed by the crystal growth process to thereby confine carriers as to the lateral direction. In another method, after the respective layers are formed, then impurities are introduced by the ion implantation technique. These methods, however, have disadvantage such that the top surface of the layers contacts the atmosphere in the etching process, so that the crystal surface is polluted or the like to thereby degrade the characteristics of the device.

Another BH type semiconductor laser device has been proposed by Japanese Patent Laid-Open Publication No. 2-65288 filed by the same assignee as the present application and "Electronic Letters, 24 (1988) 1249" by H. Narui, T. Ohata and Y. Mori in which a step portion, that is, a ridge or groove is formed on a substrate such that orientation of its crystal Surface and the extended direction of the step portion or the like are selected suitably, then hetero junction boundaries are formed on the ridge so as to extend to the vertical and lateral directions by one crystal growth process. In this case, the above described BH type structure is obtained in a manner that a compound semiconductor constituted by AlGaAs based material is used as the substrate, and respective layers are sequentially formed by utilizing the metal organic chemical vapor deposition (MOCVD) technique on a major surface of the substrate which is constituted by a {100} crystal plane, to thereby form a discontinuous dislocation in the lateral direction of the semiconductor layer by utilizing a difference in growing speeds depending on crystal orientations.

However, in the semiconductor laser device constituted by compound semiconductor material, in particular, material including phosphorus such as AlGaInP based material or the like, since the growing speed thereof depending on the crystal orientation differs from that of the AlGaAs based compound semiconductor, it is difficult to use the above-described construction having the discontinuous dislocation.

According to the inspection by the inventors of the present invention etc., in a case of forming a step portion extending to the <110> crystal axis direction on a major surface constituted by the {001} crystal plane of a compound semiconductor substrate and then forming a compound semiconductor layer constituted by material including phosphorus (P) such as AlGaInP based material by the epitaxial growth process, it has been found by analyzing the structure of the AlGaInP crystal by a transmission electron microscope that the surface of the grown film is rough and so it is difficult to form a crystal plane with a good film quality or a smooth surface. Further, it has been found that the grown AlGaInP crystal includes many twin crystals formed therein and is not a single crystal.

This is seemed to be due to the following reason. That is, when the substrate with an accurate {001} crystal plane is used, a surface of the compound semiconductor layer formed on the slanted surface of the step portion becomes an accurate {111} B crystal plane. According to the inspection by the inventors of the present invention etc., however, it has been found that since twin crystals are formed on the surface of the accurate {111} B crystal plane, the surface of the compound semiconductor layer is degraded in film surface quality as well as crystal property, as described in "Journal of Crystal Growth, 106 (1990) 197" by E. Morita, M. Ikeda, M. Inoue and K. Kaneko. Thus, the reason why the surface of the grown film formed on the step portion of the substrate becomes rough seems to be mainly due to a fact that the accurate {111} B crystal plane is formed on the step portion.

OBJECTS AND SUMMARY OF THE INVENTION

Therefore, it is an object of the present invention to provide an improved compound semiconductor device and a method of fabricating the same in which the aforementioned shortcomings and disadvantages encountered with the prior art can be eliminated.

More specifically, it is an object of the present invention to provide a compound semiconductor device constituted by compound semiconductor including phosphorus and a method of fabricating the same which can confine carriers by one crystal growth process.

It is another object of the present invention to provide a method of fabricating a compound semiconductor device in which a layer deviated from a {111} B crystal plane is formed by using a compound semiconductor substrate whose major surface is deviated to the <110> crystal axis direction from the {001} crystal plane to thereby provide the compound semiconductor device having a crystal plane of good quality with no twin.

It is still another object of the present invention to provide a compound semiconductor device in which a function layer such as an active layer or the like is configured to have a difference in index of refraction or bandgap to the lateral direction thereof to thereby decrease a threshold value and improve astigmatism thereof.

As an aspect of the present invention, there is provided a compound semiconductor device which includes a first electrode; a semiconductor substrate formed on the first electrode whose a major surface having a ridge or groove is slanted to a <110> crystal axis direction from a {001} crystal plane; a first semiconductor layer formed on the semiconductor substrate; a semiconductor function layer formed on the first semiconductor layer and having a {111} B crystal plane; a second semiconductor layer formed on the semiconductor function layer; and a second electrode formed on the second semiconductor layer, wherein the ridge or groove extends to the <110> crystal axis direction, and at least one of the first semiconductor layer, the semiconductor function layer and the second semiconductor layer includes phosphorus.

As another aspect of the present invention, there is provided a method of fabricating a compound semiconductor device which includes steps of forming a ridge or groove on a major surface of a semiconductor substrate which is formed on a first electrode and whose major surface is slanted to a <110> crystal axis direction from a {001} crystal plane; forming a first semiconductor layer on the semiconductor substrate; forming a semiconductor function layer having a {111} B crystal plane on the first semiconductor layer; forming a second semiconductor layer on the semiconductor function layer; and forming a second electrode on the second semiconductor layer, wherein the ridge or groove extends to the <110> crystal axis direction, and at least one of the first semiconductor layer, the semiconductor function layer and the second semiconductor layer includes phosphorus.

The preceding and other objects, features, and advantages of the present invention will become apparent from the following detailed description of illustrative embodiments thereof when read in conjunction with the accompanying drawings, in which like reference numerals are used to identify the same or similar parts in the several views.

DETAILED DESCRIPTION OF THE PREFERRED EMBODIMENTS

A compound semiconductor device and a fabricating method thereof according to the present invention will now be described with reference to FIGS. 1 to 8, in which cases the present invention is applied to a complex device such as a semiconductor laser device or a compound semiconductor transistor using the AlGaInP based compound semiconductor. In the figures, like reference numerals are used to identify the same or similar portions in the several views.

Figure 1:
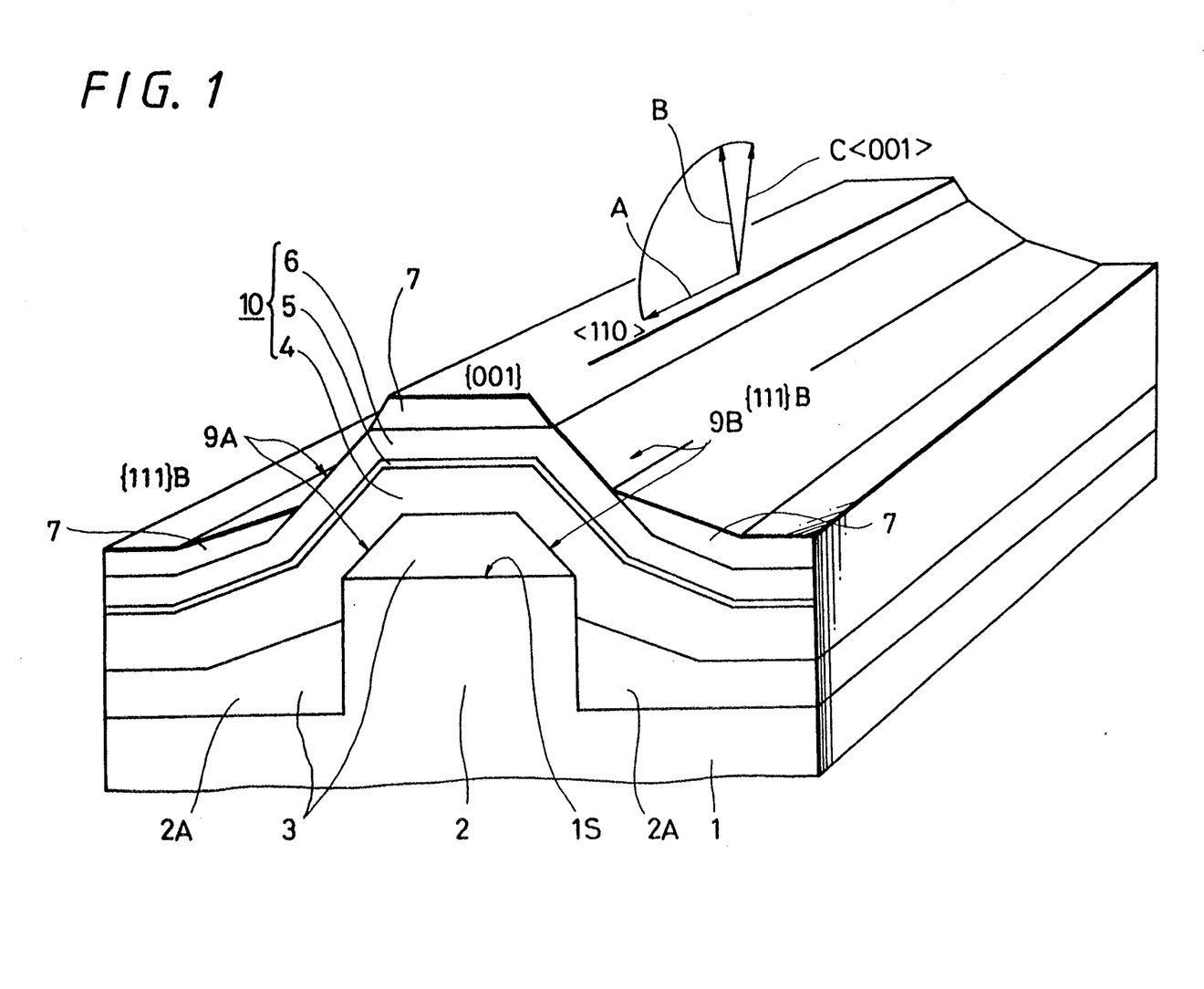
FIG. 1 is schematic perspective sectional view showing a compound semiconductor device according to a first embodiment of the present invention.
Figure 2:
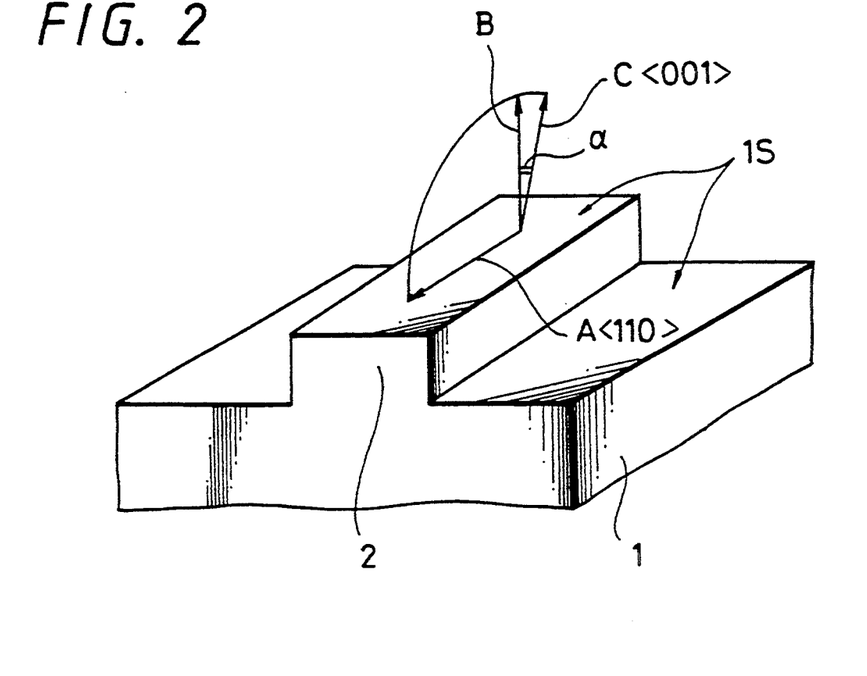
FIG. 2 schematic perspective view illustrating an example of manufacturing methods of the compound semiconductor device according to the first embodiment.

FIG. 1 shows a compound semiconductor device according to a first embodiment of the present invention. Referring to FIG. 1, firstly a compound semiconductor substrate 1 made of n-type GaAs, for example, is prepared. A major surface 1S of the substrate 1 is constituted by a surface deviated toward the <110> crystal axis direction from the {001} crystal plane. FIG. 2 shows an example of the manufacturing method of the compound semiconductor device according to the first embodiment. Referring to FIG. 2, an arrow A represents the <110> crystal axis direction, an arrow C represents a <001> crystal axis direction perpendicular to the {001} crystal plane, and an arrow B represents a direction deviated by several degrees from the <001> crystal axis direction, that is, an off direction. In this embodiment, the off direction shown by the arrow B is selected to be deviated from the <001> crystal axis by 2 degrees. That is, the substrate 1 is formed so that its major surface 1S is inclined toward the <110> crystal axis direction from the {001} crystal plane by 2 degrees. Then, a groove or a ridge, for example, a ridge 2 is formed on the major surface 1S to extend along the <110> crystal axis direction. The patterning process for forming the ridge 2 can be carried out by the vertical anisotropy etching process such as the reactive ion etching (RIE) process.

Thereafter, as shown in FIG. 1, a plurality of compound semiconductor layers are sequentially formed on the compound semiconductor substrate 1 having the ridge 2 by the epitaxial growth process by utilizing the MOCVD technique or the like. Some of the compound semiconductor layers are formed by semiconductor material including phosphorus, e.g., AlGaInP. In this regard, firstly a buffer layer 3 made of n-type GaAs or the like is formed on the substrate 1 by the MOCVD technique. That is, the epitaxial growth proceeds on the ridge 2 in a manner that slanted surfaces 9A and 9B substantially constituting the {111} B crystal planes grow while forming a substantially trapezoid-shaped configuration in a cross section thereof, so that the buffer layers 3 are formed separately on the ridge 2 and grooves 2A. As described above, since the first embodiment employs the so-called off substrate, the slanted surfaces 9A and 9B constitute crystal surfaces deviated by several degrees, in this example, 2 degrees from the {111} B crystal plane. Thus, the film surface of the buffer layer 3 will be a smooth grown surface without forming twin crystal.

Thereafter, for example, a first cladding layer 4 made of n-type AlGaInP, an active layer 5 made of intrinsic-type GaInP or the like, and a second cladding layer 6 made of p-type AlGaInP or the like are sequentially formed on the buffer layer 3 by the epitaxial growth process. In this case, a compound semiconductor 10 constituted by these semiconductor layers 4, 5 and 6 grows in a manner that slanted surfaces 9A and 9B thereof grow substantially in parallel to the slanted surfaces 9A and 9B formed on the ridge 2 to substantially constitute the {111} B crystal planes, respectively. A p-type capping layer 7 grows, when it is formed of GaAs, on regions of the second cladding layer except for the slanted surfaces 9A and 9B substantially constituting the {111} B crystal plane. Thus, in this case, the active layer 5 is provided as a function layer with substantially the {111} B crystal plane. Then, electrodes (not shown) made of Al or the like are deposited on the capping layer 7 and on the rear surface of the substrate 1, thereby the compound semiconductor device according to this embodiment, that is, a semiconductor laser being manufactured.

In this embodiment, since the active layer 5 is sandwiched by the cladding layers 4 and 6 whose band gaps are narrower than that of the active layer, the light can be confined with respect to the upper and lower direction (thickness direction).

Thus, according to the present invention, in order not to form the accurate {111} B crystal plane above the step portion, that is, a ridge or a groove, the substrate is constituted to have a major surface deviated toward the <110>axis direction by several degrees from the {001} crystal plane, thereby forming a so-called off substrate. Alternately, the substrate is constituted to have a major surface deviated toward a crystallographically equivalent direction to the <110> crystal axis direction, e.g., a <−1−1−1>axis direction by several degrees from the {001} crystal plane, thereby forming an off substrate. Thereafter, a step portion, that is, a ridge or a groove extending to the <110>crystal axis direction is formed on the thus configured off substrate, then a compound semiconductor layer is formed thereon by the epitaxial growth process, so that a surface of the compound semiconductor layer is slightly deviated from the {111} B crystal plane. It has been clarified that twin is not formed on a crystal plane, that if, off {111} B crystal plane thus deviated from the {111} B crystal plane.

Further, it has been known that when a AlGaInP crystal is grown by utilizing the MOCVD technique on a substrate formed by {001} GaAs crystal, the grown layer constitutes an ordered structure. The ordered structure constitutes such a structure that a Ga atom (or Al atom) and an In atom are alternately laminated on two kinds of {111} crystal planes, that is, superlattice structure. Further, it has been known that the ordered structure is not formed on a GaAs crystal substrate formed by the {111} B crystal plane.

Figure 5:
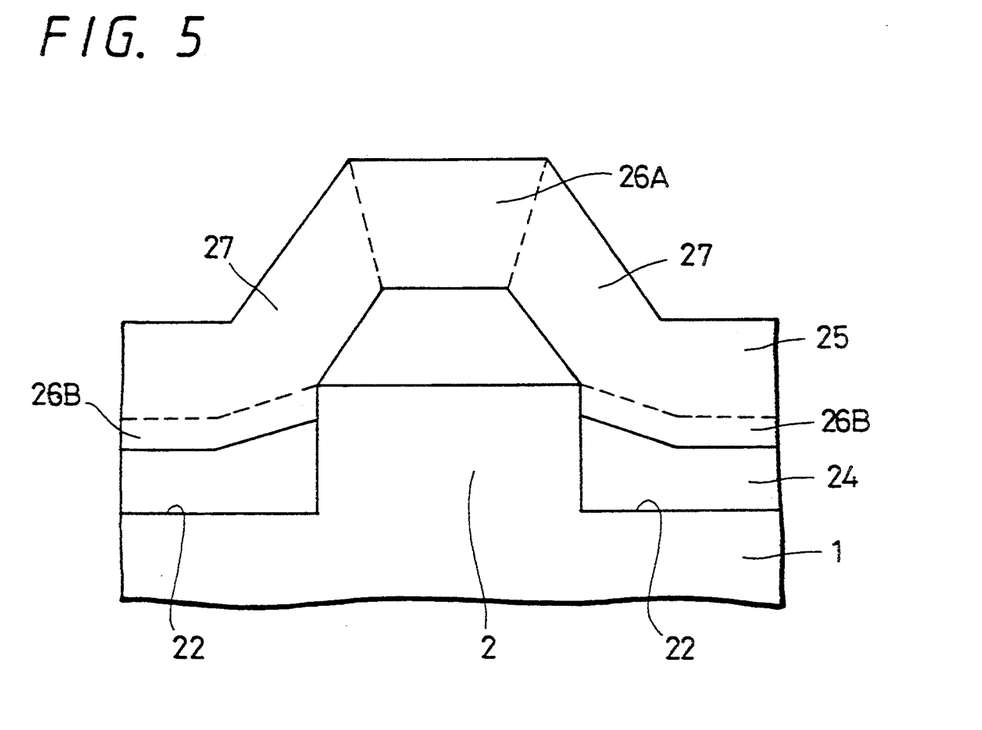
FIG. 5 is a schematic sectional view of a part of the compound semiconductor device showing its crystal growing state.

According to the inspection by the inventors of the present invention etc., it has been found that when a step portion is formed on a compound semiconductor substrate having a major surface deviated to the <110> crystal axis direction from the {001} crystal plane and then an AlGaInP crystal is grown on the step portion, ordered structure regions are separately formed on the step portion. That is, as shown in FIG. 5, when a ridge 2 is formed to extend to the <110> crystal axis direction on a compound semiconductor substrate 1 formed by GaAs and then a GaAs layer 24 and an AlGaInP layer 25 are grown on the ridge 2 by the epitaxial growth process, the following fact has been found by analyzing the structure of the AlGaInP layer 25 by using a transmission electron microscope. That is, the AlGaInP layer 25 is separated into a first region 26A on the ridge 2 and second and third regions 26B and 27 within a groove, and each of the first and second regions 26A and 26B constitute the ordered structure, while the third regions 27 constitute the disordered structure.

It has been known that the AlGaInP crystal having the ordered structure is narrower in a bandgap than the disordered region. Thus, regions having different bandgaps can be formed on the ridge or within the groove. The difference in the bandgaps is about 50 mev, and the compound semiconductor device can be configured to confine carriers on the ridge or within the groove by utilizing the difference in bandgaps.

When crystal planes and axis or orientations crystallographically equivalent to the {001} crystal plane and the <110> crystal axis direction are used, respectively, the same technical advantages as the case utilizing the {001}crystal plane and the <110> crystal axis direction can be obtained.

In the present specification, the crystal orientation or direction is represented by a coordinate system which is obtained when a III-group Ga atom is placed on 000 and a V-group As atom is placed on 1/41/41/4.

Further, the inventors of the present invention or the like have found that when the AlGaInP crystal grows on the {001} GaAs crystal substrate by utilizing the MOCVD technique, the ordered structure regions of the AlGaInP crystal layer is separated on the ridge 2 and within the grooves.

Thus, in this case, the active layer 5 above the ridge 2 can be configured so as to be sandwiched at both sides thereof by intermixed or disordered regions having a bandgap narrower than that of the active layer. The difference in the bandgaps will be about 50meV in this case. Thus, the carrier can be confined to the lateral direction of the active layer 5, and so that the semiconductor laser device with a lowered threshold level can be provided.

Figure 3:
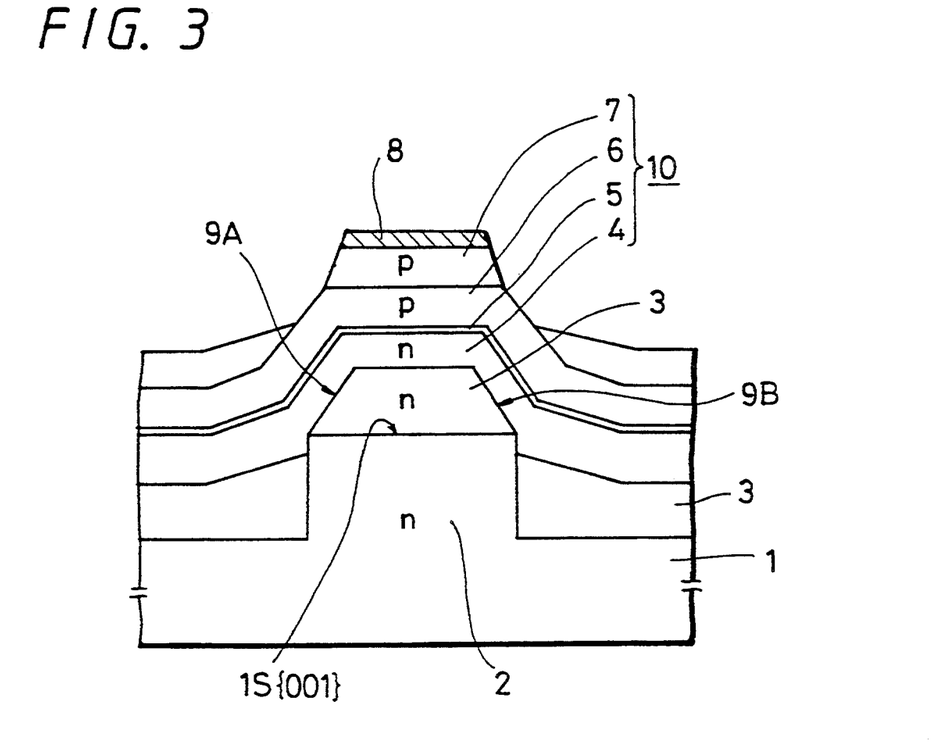
FIG. 3 is a schematic sectional view showing a compound semiconductor device according to a second embodiment of the present invention.
Figure 4:
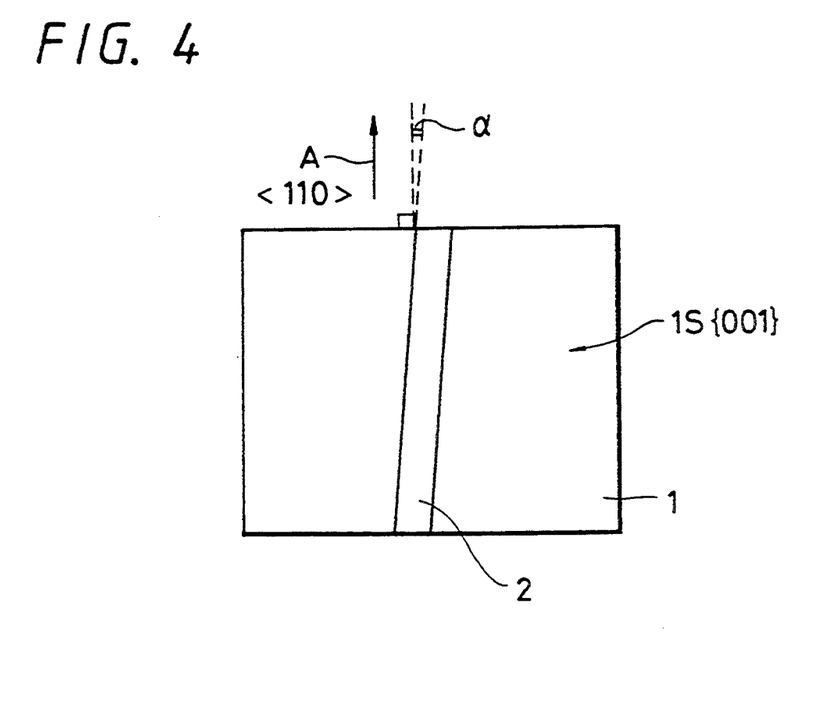
FIG. 4 is a schematic plan view illustrating an example of manufacturing methods of the compound semiconductor device according to the second embodiment.

FIG. 3 shows a compound semiconductor device according to the second embodiment of the present invention. FIG. 4 shows a process of a manufacturing method of the compound semiconductor device according to the second embodiment.

The compound semiconductor device of the second embodiment will be described with a reference to FIGS. 3 and 4. As shown in FIG. 4, firstly a compound semiconductor substrate 1 which is made of n-type GaAs or the like and has a major surface 1S constituted by an accurate {001} crystal plane is prepared. A ridge or a groove, e.g., a ridge 2 is formed on the major surface 1S to extend to a direction slightly deviated from the <110> crystal axis direction. In FIG. 4, an angle α represents an angle between the extended direction of the ridge 2 and the <110> crystal axis direction, and the angle α is set to be 2 degrees in this example.

Thereafter, as shown in FIG. 3, a plurality of compound semiconductor layers 4 to 7 including phosphorus are sequentially formed on the compound semiconductor substrate 1 by the epitaxial growth process. In this embodiment, a buffer layer 3 made of n-type GaAs or the like, a first cladding layer 4 made of n-type AlGaInP or the like, an active layer 5 made of intrinsic-type GaInP or the like, a second cladding layer 6 made of p-type AlGaInP or the like, and a capping layer 7 made of p-type GaAs or the like are sequentially formed on the ridge 2 and the grooves by the epitaxial growth process by utilizing the MOCVD technique. Then, an electrode 8 made of Al or the like is deposited on the capping layer 7 and further an electrode (not shown) made of by Al or the like is deposited on the rear surface of the substrate 1, thereby constituting the compound semiconductor device.

In this case, like the embodiment of FIG. 1, the side walls of the buffer layer 3 constitute the off crystal planes deviated by 2 degrees from the accurate {111} B crystal plane on the ridge 2, so that slanted surfaces 9A and 9B with good film quality can be formed. Then, each of the first cladding layer 4, active layer 5, second cladding layer 6 and capping layer 7 grows in a manner that slanted surfaces 9A and 9B thereof grow substantially in parallel to the slanted surfaces 9A and 9B of the buffer layer 3 to constitute off crystal planes deviated by 2 degrees from the {111} B crystal planes.

According to the thus constituted compound semiconductor device, the active layer 5 above the ridge 2 is sandwiched between the first and second cladding layers 4 and 6 to perform the optical confinement. Further, since a region of the active layer 5 above the ridge 2 is configured by the ordered structure but the opposite side regions thereof are configured by the disordered structure, the active layer 5 is also sandwiched by layers with a larger bandgap as to the lateral direction thereof. Thus, the carrier can be confined as to the lateral direction of the active layer 5, and so that the semiconductor laser device with a lowered threshold level can be provided.

Figure 6:
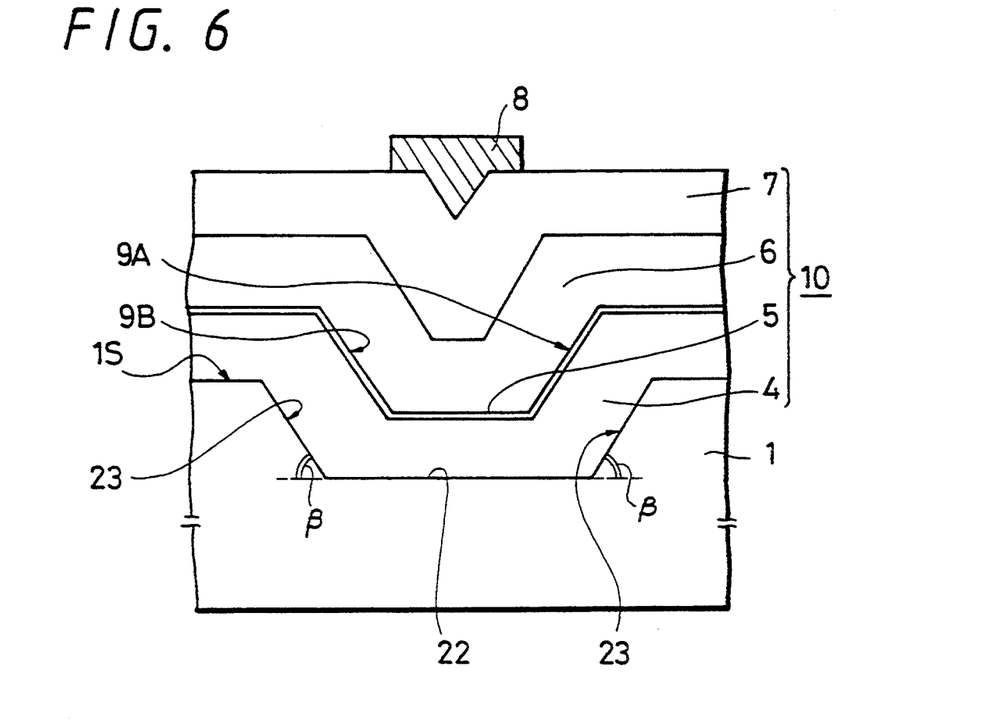
FIG. 6 is a schematic sectional view showing the compound semiconductor device according to a third embodiment of the present invention.

FIG. 6 shows a compound semiconductor device according to the third embodiment of the present invention. In FIG. 6, like parts corresponding to those of FIGS. 1 and 3 are marked with the same references.

In this embodiment, like the embodiment shown in FIG. 2, an off substrate 1 whose major surface is deviated to the <110> crystal axis direction by several degrees from the {001}crystal plane is provided, and a groove 22 is formed on the major surface thereof to extend along the <110> crystal axis direction. Alternatively, like the embodiment shown in FIG. 4, a substrate 1 having a major surface constituted by the accurate {001} crystal plane is prepared, and a groove 22 is formed on the major surface thereof to extend in a direction deviated by several degrees, e.g., 2 degrees from the <110>crystal axis direction. The substrate 1 may be made of n-type GaAs, for example.

The shape of the groove 22 is formed by the wet etching process or the like in a manner that an angle β between each of side walls 23 thereof and the major surface 1S is 54.7 degrees or less so that epitaxial layers growing on the groove 23 naturally generate crystal planes which are deviated from the {111} B crystal plane by several degrees.

Thereafter, as shown in FIG. 6, various compound semiconductor layers, in this embodiment, a first cladding layer 4 made of n-type AlGaInP or the like, an active layer 5, that is, a function layer made of GaInP or the like, a second cladding layer 6 made of p-type AlGaInP or the like, and a capping layer 7 made of p-type GaAs or the like are sequentially formed on the groove 22 by the epitaxial growth process by utilizing the MOCVD technique. Then, an electrode 8 made of Al or the like is deposited on the capping layer 7 and further an electrode (not shown) made of Al or the like is deposited on the rear surface of the substrate 1.

According to the third embodiment of the thus constituted compound semiconductor device, like the above-described embodiments, side walls 9A and 9B of the respective layers constitute the off crystal planes deviated by several degrees, e.g., 2 degrees from the accurate {111} B crystal plane in the groove 22, so that slanted surfaces 9A and 9B with a good film quality can be formed. Further, the active layer 5 above the groove 22 is sandwiched between the first and second cladding layers 4 and 6 to perform the optical confinement. Further, since a region of the active layer 5 in the groove 22 is configured by the ordered structure but the side regions thereof are configured by the disordered structure, the active layer 5 is also sandwiched by layers with a larger bandgap as to the lateral direction thereof. Thus, the carrier can be confined as to the lateral direction of the active layer 5, and so that the semiconductor laser device with a lowered threshold level can be provided.

As described above, in each of these embodiments, the semiconductor laser device is configured in a manner that the extended direction of the ridge 2 or the groove 22 is set to be deviated by 2 degrees from the <110> crystal axis direction. In this case, in order to prevent such a phenomenon that a light beam reflects to the lateral direction in the active layer when it propagates to a resonator direction, the deviation angle α is set to be 8 degrees or less, preferably.

Figure 7:
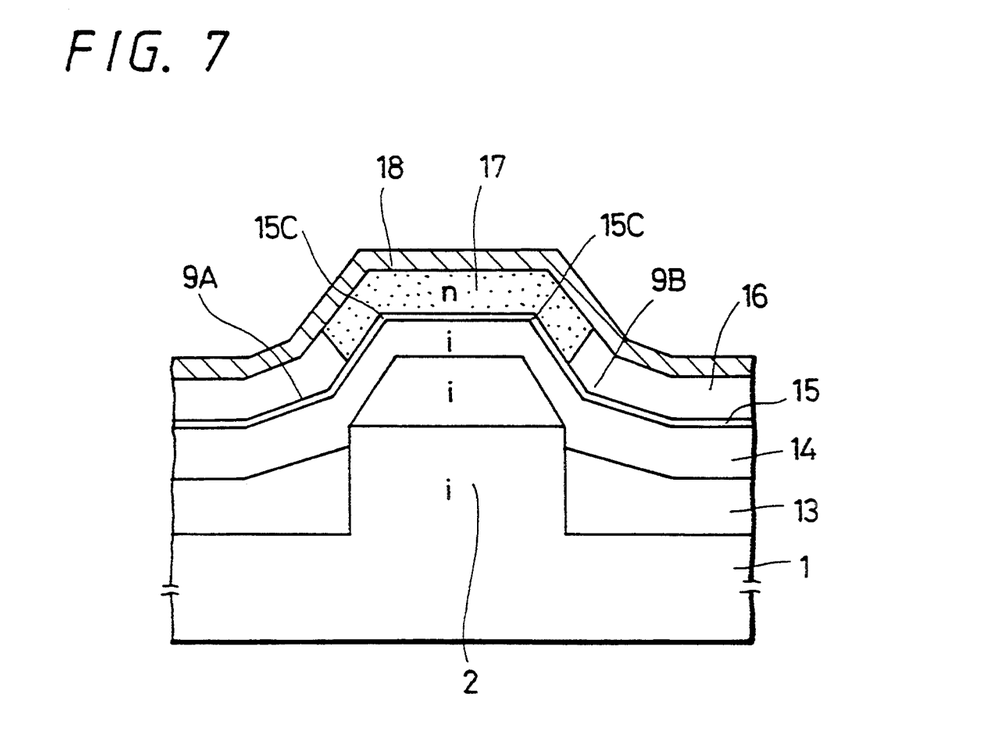
FIG. 7 is a schematic sectional view showing the compound semiconductor device according to a fourth embodiment of the present invention.
Figure 8:
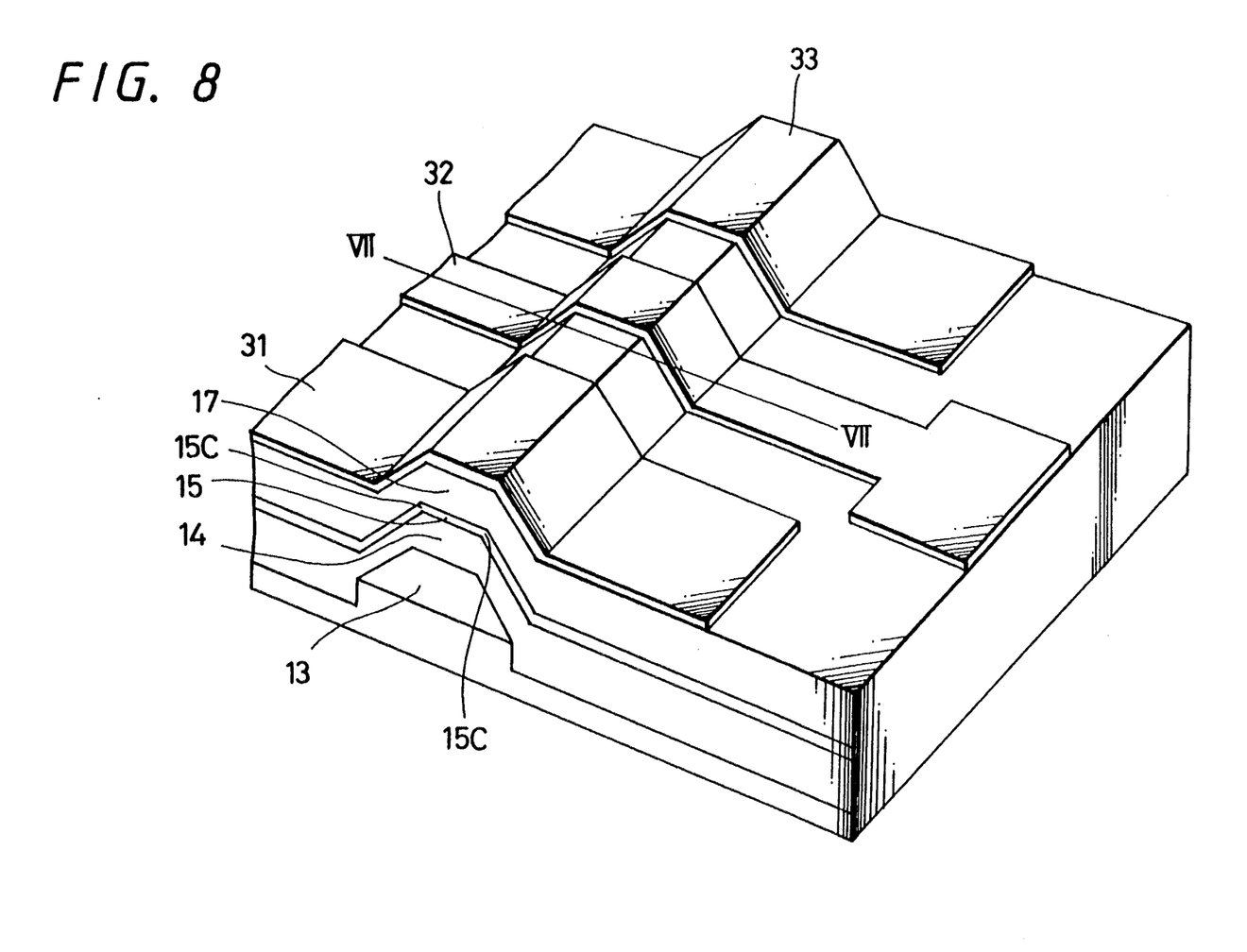
FIG. 8 is a schematic perspective view illustrating the compound semiconductor device of FIG. 7.

FIG. 7 is a sectional view showing the compound semiconductor device according to the fourth embodiment of the present invention which is applied to a compound semiconductor transistor of one-dimensional channel configuration and FIG. 8 is a perspective view thereof. In this embodiment, also like the embodiment shown in FIG. 2, an off substrate 1 whose major surface is deviated to the <110> crystal axis direction by several degrees from the {001} crystal plane is provided, and a ridge 2 is formed on the major surface thereof to extend along the <110> crystal axis direction. Alternatively, like the embodiment shown in FIG. 4, a substrate 1 having a major surface constituted by the accurate {001} crystal plane is prepared, and a ridge 2 is formed on the major surface thereof to extend to a direction deviated by several degrees from the <110> axis direction. The substrate 1 may be made of semi-insulating GaAs, for example.

Thereafter, as shown in FIG. 7, a buffer layer 13 made of semi-insulating GaAs or the like, a compound semiconductor layer 14 made of intrinsic-type AlGaInP or the like, a function layer 15 formed by intrinsic-type AlGaInP with a thickness of about 100 angstrom or less, and a compound semiconductor layer 16 made of AlGaInP or the like with a thickness of about 500 angstrom are sequentially formed on the ridge 2 and the major surface by the epitaxial growth process by utilizing the MOCVD technique.

In this case, since slanted side walls 9A and 9B of the respective layers grow on the off substrate or the ridge extended to the off direction by the epitaxial growth process, they constitute planes slanted by several degrees from the {111} B crystal plane, so that the slanted surfaces 9A and 9B with good film quality can be formed.

Then, an n-type impurity is diffused in a region of the compound semiconductor layer 16 only above the ridge 2 to form an impurity injected region 17. Thereafter, an electrode 18 made of Al or the like is deposited on the region 17 by the vacuum evaporation process or the like. In this case, as shown in FIG. 8, a source electrode 31, a gate electrode 32 and a drain electrode 33 are formed by the patterning process so that they extend in the direction crossing the extended direction of the ridge 2, respectively.

According to this embodiment, since the function layer 15 is constituted to have the thickness of about 100 angstrom or less to thereby act as a crystal layer with quantum effect, electrons supplied from the n-type compound semiconductor layer 16 situated above the function layer are pooled at bent portions of the function layer 15 above the ridge 2 to form a channel region 15C of one-dimensional electron gas. Thus, a -high electron mobility compound semiconductor transistor with a one-dimensional channel can be provided.

While the ordered structure is formed in the whole region of the compound semiconductor layer above the ridge 2 as described above, the present invention may be arranged in a manner that the ordered structure is partially formed along the thickness direction thereof since the formation of the ordered structure is suppressed by doping impurities at a high density.

The materials of the compound semiconductor device according to the present invention is not limited to those of the above-described embodiments and the device may be constituted by various other materials. For example, the materials of the devices in FIGS. 1, 3 and 6 may be changed into materials with opposite conductivities.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A compound semiconductor device comprising:
   a first electrode;
   a semiconductor substrate formed on said first electrode, said substrate having a major surface with a step portion slanted at an angle to a <110> crystal axis direction from a {001} crystal plane, said step portion having a first surface extending between two slanting surfaces with the first surface being parallel to the major surface and the slanting surfaces deviating from the {111} B crystal plane by several degrees;
   a first semiconductor layer formed on the first surface and slanting surfaces of said semiconductor substrate;
   a semiconductor function layer formed on said first semiconductor layer and having different bandgaps for the regions overlying the first surface and slanting surfaces;
   a second semiconductor layer formed on said semiconductor function layer; and
   a second electrode formed on said second semiconductor layer, at least one of said first semiconductor layer, said semiconductor function layer and said second semiconductor layer includes phosphorus.

2. A compound semiconductor device according to claim 1, wherein said angle that said major surface of said semiconductor substrate is slanted to the <110> crystal axis direction from the {001}crystal plane is in a range larger than 0 degree and smaller then 10 degrees.

3. A compound semiconductor device according to claim 2, wherein said semiconductor function layer has a bandgap smaller than those of said first and second semiconductor layers.

4. A compound semiconductor device according to claim 3, wherein one of said first and second semiconductor layers serves as a layer for supplying electrons to said semiconductor function layer.

5. A compound semiconductor device according to claim 1, wherein the different bandgaps of the semiconductor function layer are formed by the function layer having an ordered structure region over the first surface and between intermixed and disordered regions.

6. A compound semiconductor device according to claim 1, wherein the step portion is a ridge.

7. A compound semiconductor device according to claim 1, wherein the step portion is a groove.

8. A light emitting device comprising:
   a first electrode;
   a semiconductor substrate formed on said first electrode, said substrate having a major surface with a step portion slanted at an angle to a <110> crystal axis direction from a {001} crystal plane, said step portion having a first surface extending between two slanting surfaces with the first surface being parallel to the major surface and the slanting surfaces deviating from the {111} B crystal plane by several degrees;
   a first cladding layer made of first semiconductor material and formed on the first surface and slanting surfaces of the step portion of said semiconductor substrate;
   an active layer made of second semiconductor material formed on said first cladding layer and having different bandgaps for regions overlying the first surface and the slanting surfaces;
   a second cladding layer made of the second semiconductor material and formed on said active layer; and
   a second electrode formed on said second cladding layer, wherein at least one of said first cladding layer, said active layer and said second cladding layer includes phosphorus.

9. A light emitting device according to claim 8, wherein said angle that said major surface of said semiconductor substrate is slanted to the <110> crystal axis direction from the {001} crystal plane is in a range larger than 0 degree and smaller than 10 degrees.

10. A light emitting device according to claim 9, wherein at least one of said first cladding layer and said second cladding layer is made of AlGaInP based semiconductor material.

11. A light emitting device according to claim 10, wherein said semiconductor substrate is made of GaAs.

12. A light emitting device according to claim 8, wherein the step portion is a ridge.

13. A light emitting device according to claim 8, wherein the step portion is a groove.

14. A light emitting device according to claim 8, wherein the different bandgaps of the active layer are formed by the active layer having an ordered structure region over the first surface and between intermixed and disordered regions.

* * * * *